(12) United States Patent
Tachikawa et al.

(10) Patent No.: US 7,718,352 B2
(45) Date of Patent: May 18, 2010

(54) PROCESS FOR PRODUCING ELECTROLUMINESCENT ELEMENT

(75) Inventors: Tomoyuki Tachikawa, Tokorozawa (JP); Norihito Itoh, Misato (JP); Keisuke Hashimoto, Abiko (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 554 days.

(21) Appl. No.: 11/787,911

(22) Filed: Apr. 18, 2007

(65) Prior Publication Data

US 2007/0287106 A1    Dec. 13, 2007

(30) Foreign Application Priority Data

Apr. 19, 2006   (JP)   ............................... 2006-115217

(51) Int. Cl.
*G03C 5/00*   (2006.01)

(52) U.S. Cl. ...................................... 430/346; 430/320

(58) Field of Classification Search .................... None
See application file for complete search history.

(56) References Cited

FOREIGN PATENT DOCUMENTS

JP        2002-170673    *    6/2002

OTHER PUBLICATIONS

Translation JP-2002-170673(Jun. 2002).*

* cited by examiner

*Primary Examiner*—Mark F Huff
*Assistant Examiner*—Anna L Verderame
(74) *Attorney, Agent, or Firm*—Harness, Dickey & Pierce, PLC

(57) ABSTRACT

There is provided a process for producing an EL element by photolithography, which process can produce an EL element having improved luminescence efficiency. The production process comprises the steps of removing a photoresist from photoresist layer-covered parts of an electroluminescent layer and cleaning the surface of the electroluminescent layer parts from which the photoresist has been removed.

8 Claims, 1 Drawing Sheet

PROCESS FOR PRODUCING ELECTROLUMINESCENT ELEMENT

BACKGROUND OF THE INVENTION

1. Field of the Invention

The present invention relates to a process for producing an electroluminescent element. More particularly, the present invention relates to a process for producing an electroluminescent element, which can realize the provision of an electroluminescent element with high luminescence efficiency even by photolithography.

2. Background Art

Electroluminescent (hereinafter referred to as "EL") elements have drawn attention as self-luminous planar display elements. In EL elements, holes and electrons injected from opposed electrodes are combined with each other within a luminescent layer, energy in this combination excites a fluorescent material within the luminescent layer, and luminescence of color depending upon the fluorescent material takes place.

Among others, organic thin-film EL displays using organic materials as luminescent materials are very advantageous, for example, in that high-brightness luminescence can be realized even at an applied voltage of slightly lower than 10 V, that is, high luminescence efficiency can be realized, and luminescence can take place in a simple element structure. Accordingly, it is expected that these organic thin-film EL displays could be applied to advertisements where luminescent display of a specific pattern is performed, as well as to other low-price simplified displays.

Such organic EL elements generally have a basic structure comprising a first electrode layer and a second electrode layer stacked on top of each other through an organic EL layer, and, in general, the first electrode layer and the organic EL layer are patterned to form an element which can provide different luminescent colors.

Various patterning methods for these EL elements have been proposed, and examples thereof include a method in which a luminescent material is vapor deposited through a shadow mask, a method in which selective coating is carried out by an ink jet recording method, a method in which a specific luminescent coloring matter is decomposed by ultraviolet irradiation, and a method using screen printing. These methods, however, could not have realized an EL element having high luminescence efficiency and high light take-out efficiency and could not have realized high-definition patterning in a simple production process.

To overcome the above problem, a process for producing an EL element has been proposed in which the luminescent layer is patterned by photolithography (see, for example, Japanese Patent Laid-Open No. 170673/2002). According to this process, unlike patterning of the luminescent layer by the conventional vapor deposition, for example, a vacuum system having a highly accurate alignment function is not necessary, and, thus, the EL element can be produced relatively easily at low cost. Further, in this process, unlike the case where an ink jet recording method is used, for example, the formation of an auxiliary structure in patterning and the pretreatment of the substrate are not necessary. Accordingly, this process is advantageous in that the production process is simple and, at the same time, the accuracy of the patterning by the photolithography is higher than the delivery accuracy of an ink jet recording head.

The above production process of an EL element using the photolithographic method generally comprises the following steps. Specifically, a material for luminescent layer formation is coated onto a substrate to form a luminescent layer, and a photoresist layer is covered on the luminescent layer. The photoresist layer is exposed through a photomask so that a desirably patterned luminescent layer can be formed. Development is then carried out with a photoresist developing solution, followed by washing to remove the photoresist layer in its exposed areas. The luminescent layer in its parts exposed on the surface of the assembly as a result of the removal of the photoresist layer are removed by etching or the like to form a desirably patterned luminescent layer. The above steps are repeated to pattern luminescent layers corresponding to respective colors. Finally, the remaining photoresist layer provided on the luminescent layers is separated by a peeling liquid to remove the photoresist layer, whereby patterning of luminescent layers corresponding to respective colors, for example, red R, green G, and blue B is carried out. An EL element is then prepared through the step of forming a second electrode on the luminescent layers of the respective colors.

The EL element in which the luminescent layers have been patterned by photolithography, however, sometimes has unsatisfactory luminescence characteristics, and, thus, the development of an EL element having higher luminescence efficiency has been desired.

SUMMARY OF THE INVENTION

The present inventors have now found that a some amount of a residue is left on the luminescent layer side in the step of separating the photoresist layer and that roughening of the surface of the luminescent layer caused by the separation adversely affects the luminescence efficiency of the EL element. As a result, the present inventors have found that the luminescence efficiency of the EL element can be improved by removing the surface layer part in the luminescent layer after the removal of the photoresist layer. The present invention has been made based on such finding.

Accordingly, an object of the present invention is to provide a production process of an EL element by photolithography that can produce an EL element having high luminescence efficiency.

According to the present invention, there is provided a process for producing an electroluminescent element comprising a patterned electroluminescent layer, said process comprising the steps of:

forming an electroluminescent layer on a substrate having at least an electrode layer formed thereon;

covering a photoresist layer on said electroluminescent layer;

exposing said photoresist layer through a photomask and developing the exposed photoresist layer to pattern the photoresist layer;

removing the electroluminescent layer in its areas, which are exposed on the surface of the assembly and are not covered with the photoresist layer as a result of said patterning of the photoresist layer, to pattern said electroluminescent layer;

removing the remaining photoresist on the electroluminescent layer covered with said photoresist layer; and cleaning the surface of the electroluminescent layer from which said photoresist has been removed.

According to the production process of the present invention, after the separation of the photoresist layer, no residue is left on the luminescent layer, and the surface of the luminescent layer is smooth. Therefore, an EL element having high luminescence efficiency can be produced.

DETAILED DESCRIPTION OF THE INVENTION

Production Process of Electroluminescent Element

Figure 1:
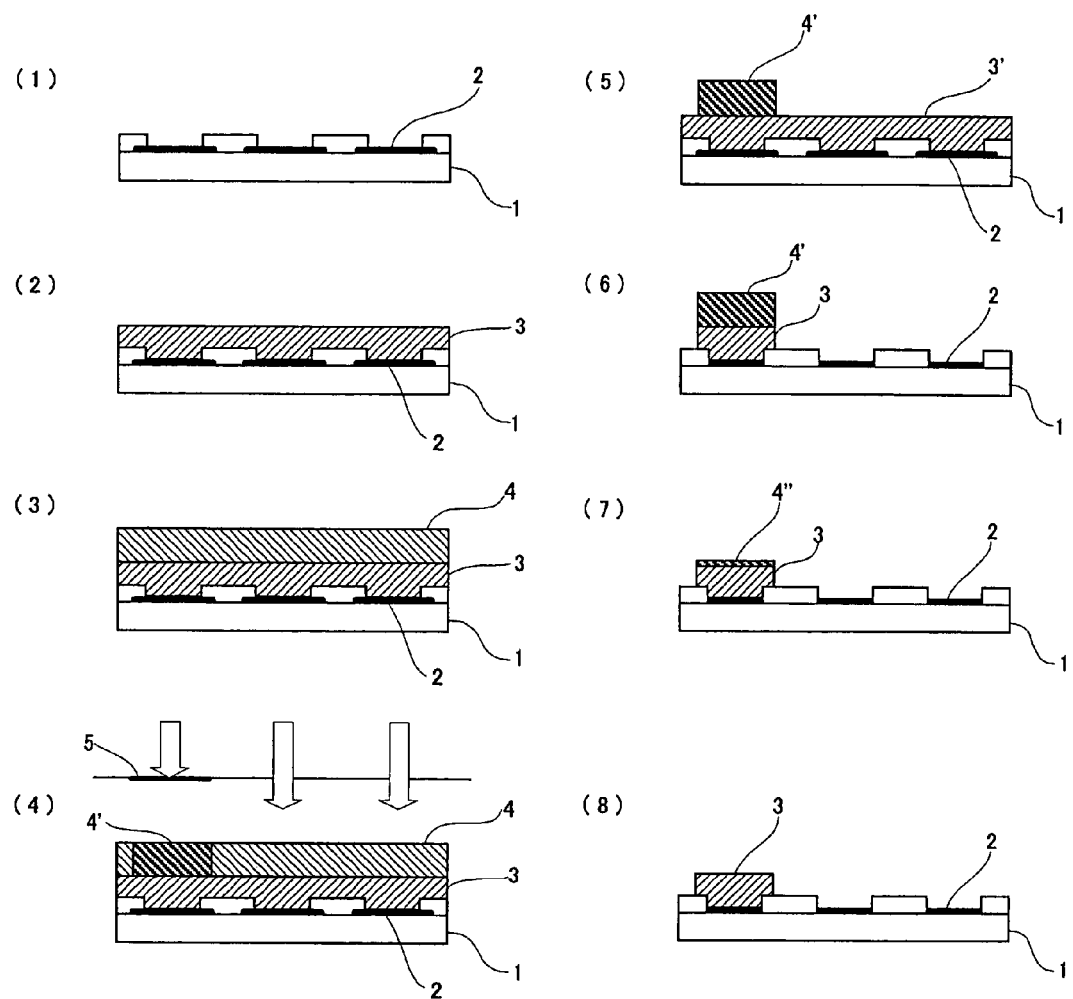
FIG. 1 is a schematic diagram illustrating the production process of an EL element according to the present invention.

The production process of an EL element according to the present invention will be described with reference to the accompanying drawings.

FIG. 1 is a schematic diagram illustrating the production process of an EL element by photolithography. The photolithography refers to a method which forms any desired pattern depending upon a light irradiation pattern by taking advantage of such a phenomenon that, upon exposure to light, a film in its exposed areas undergoes a change in solubility.

A substrate 1 having a first electrode layer 2 provided at its positions corresponding to respective EL layer positions is first provided (FIG. 1 (1)). A material for EL layer formation is coated onto the substrate 1 to form an EL layer 3 (FIG. 1 (2)). The material for EL layer formation comprises the following luminescent materials. A coating liquid prepared by dissolving or dispersing these luminescent materials in a suitable solvent is coated, and the coating is dried to form an EL layer. The coating method is not particularly limited, and, for example, conventional spin coating, casting, dipping, bar coating, blade coating, roll coating, gravure coating, flexo printing, and spray coating are suitable for the coating. A vapor deposition method, in which a luminescent material is vapor deposited on a substrate using a vacuum evaporation system, may be used as other method for forming an EL layer on the whole area of a base material.

Next, a coating liquid for photoresist formation is coated on the formed EL layer 3, and the coating is dried to form a photoresist layer 4 (FIG. 1 (3)). This drying step is preferably carried out under reduced pressure, and vacuum drying at room temperature is more preferred.

The photoresist used in the present invention is not particularly limited and may be of either positive-working type or negative-working type. Preferably, however, the photoresist is not soluble in solvents for the formation of the EL layer such as the luminescent layer. Specific examples of photoresists usable herein include novolak resin systems and rubber-bisazide systems. In film formation to form a photoresist layer, from the viewpoint of preventing mixing and dissolution of the EL layer such as the luminescent layer and the material for photoresist formation to maintain luminescence characteristics inherent in the luminescent layer, preferably, the solvent for the photoresist used does not dissolve the luminescent material constituting the EL layer. Specific examples of such solvents include propylene glycol monomethyl ether acetate (PGMEA), ethyl lactate, butyl acetate, and other solvents such as cellosolve solvents. However, it should be noted that the solvent is not limited to these solvents only so far as the solvent does not attack the luminescent layer.

Subsequently, the assembly is exposed from above the photoresist layer 4 covering the EL layer 3 through a photomask 5 (FIG. 1 (4)), and development is carried out for patterning to form a pattern 4' in a desired form (FIG. 1 (5)). The exposure is generally carried out by ultraviolet light irradiation although the exposure method may vary depending upon the material for photoresist formation. Further, in the development, the use of a developing solution, which does not dissolve the EL layer such as the luminescent layer, is preferred. Specifically, conventional organic alkali developing solutions may be used. However, the developing solution is not limited to them only, and inorganic alkali developing solutions or aqueous solutions, which can develop the photoresist layer, may also be used as the developing solution. After the development of the photoresist layer, the patterned surface is preferably cleaned with water.

Next, EL layer 3' exposed on the surface of the assembly and not covered by the photoresist layer as a result of the patterning, that is, EL layer-exposed part, is removed for patterning to form a patterned EL layer (FIG. 1 (6)). The removal of the EL layer 3' may be carried out by etching. Etching methods are classified into a wet method using a solvent or the like and a dry method. In the present invention, the use of the dry method characterized by anisotropy (the so-called "dry etching") is preferred.

The dry etching method is preferably a reactive ion etching method. When the reactive ion etching method is used, the luminescent material (material for EL layer formation) is chemically reacted and consequently is decomposed into smaller-molecular weight compounds which can be removed from on the substrate by gasification or evaporation. Thus, patterning can be carried out with high etching accuracy in a short time.

Regarding the dry etching, preferably, oxygen only or an oxygen-containing gas is used. The use of oxygen only or an oxygen-containing gas is advantageous in that, since the luminescent material constituting the EL layer can be oxidatively decomposed, the unnecessary luminescent material on the substrate can be removed and, further, processing can be carried out with high etching accuracy in a short time. Further, when oxygen only or an oxygen-containing gas is used, there is no possibility that an electrode layer formed of an oxide transparent electroconductive material, which will be described later, is disadvantageously etched. Therefore, advantageously, electrode characteristics are not deteriorated, and, thus, the surface of the electrode can be rendered clean without carrying out cleaning and the like.

Atmospheric pressure plasma is preferably used in the dry etching. When the atmospheric pressure plasma is used, dry etching, which usually requires the use of a vacuum device, can be carried out under the atmospheric pressure. Accordingly, the necessary treatment time and production cost can be advantageously reduced. In the atmospheric pressure plasma method, the luminescent material is oxidatively decomposed by plasmatized oxygen in the air. In this case, the gas composition in the reaction atmosphere can be regulated as desired by gas replacement and circulation.

Next, a photoresist layer part 4' remaining on the EL layer 3 is removed (FIG. 1 (7)). This removal is carried out by separating the photoresist layer part 4' with a peeling liquid. Specifically, the photoresist layer can be separated, for example, by a method in which the substrate is immersed in the photoresist peeling liquid, or by a method in which the photoresist peeling liquid is showered on the substrate. The peeling liquid is not particularly limited so far as it does not dissolve the luminescent layer in the organic EL layer and can dissolve the photoresist layer. Further, the solvent for the photoresist as such may also be used. When a positive-working resist is used, a method may be adopted in which, after exposure to ultraviolet light, separation is carried out with a liquid listed above as the photoresist developing solution.

Upon the removal of the photoresist, in some cases, a residue 4" is somewhat left on the patterned EL layer 3. Further, in some cases, ions in the photoresist or low-molecular weight compounds are disadvantageously diffused into the EL layer with the elapse of time. The residue 4" and the compounds sometimes adversely affect the luminescence characteristics of the EL layer. The production process according to the present invention further comprises the step of further removing the surface layer part in the electroluminescent layer from which the photoresist has been removed (FIG. 1 (8)). Thus, the residue and compounds present on the surface part of the EL layer can be removed by removing the outermost surface layer part of the EL layer 3, and the luminescence efficiency of the EL element can be improved.

The surface of the EL layer after the removal of the photoresist layer is in many cases in such a state that the smoothness has been lost. The formation of an electron injection layer, a second electrode layer and the like on this rough surface sometimes results in lowered luminescence efficiency. In the present invention, the removal of the surface layer part in the electroluminescent layer from which the photoresist has been removed, can remove the residue and compounds and, at the same time, can smoothen the surface of the EL layer, contributing to further improved luminescence efficiency. The term "surface layer part" as used herein refers to a part including not only the outermost surface part of the EL layer but also the inside of the EL layer to a certain depth. This is because, due to the photoresist, the residue and the like are sometimes diffused on the outermost surface of the EL layer, as well as into the inside of the EL layer. In the present invention, the surface layer part in the EL layer is preferably removed to a depth of about 5 to 300 nm, more preferably 10 to 100 nm, from the outermost surface of the EL layer. When the removal depth (thickness) is less than 5 nm, the residue and the like present within the EL layer cannot be completely removed and, further, the surface smoothness is also unsatisfactory. On the other hand, when the removal depth exceeds 300 nm, the removal part is so large that the cost effectiveness is unfavorably low.

It is a matter of course that the EL layer 3 is formed in a thickness determined by taking the removal layer thickness into consideration.

In the present invention, the step of removing the EL layer may be carried out by a method in which the surface layer in the EL layer is dissolved in and removed by a solvent which dissolves only the material constituting the EL layer, or by a method in which the surface layer in the EL layer is physically shaved off.

In the present invention, preferably, the electroluminescent layer comprises a buffer layer and a luminescent layer. In this case, the luminescent layer is formed on the buffer layer. When the surface layer (that is, the surface layer in the luminescent layer) part in the EL layer is removed with a solvent, the solubility of the luminescent layer in the solvent is preferably not less than 0.0001 as measured under conditions of 25° and one atom. The residue and the like present within the EL layer can be completely removed by cleaning the surface layer in the luminescent layer with a solvent having this solubility. Further, since the surface layer part is dissolved in the solvent, the smoothness of the surface layer in the luminescent layer is improved. The term "solubility" as used herein refers to the weight (g) of the EL layer (luminescent layer) dissolved in 1 g of the solvent.

The solvent may vary depending upon the material constituting the luminescent layer. For example, when materials for luminescent layer formation, which will be described later, are used, for example, the following solvents are suitable: ketone solvents such as acetone, methyl ethyl ketone, and methyl isobutyl ketone; cellosolve solvents such as PGMEA, n-butylcellosolve and butylcellosolve acetate; aromatic solvents such as xylene, toluene, benzene, anisole, tetralin, and mesitylene; solvents such as tetrahydrofuran, dimethyl sulfoxide, and dimethyl formamide; and mixed solvents composed of the above solvents or mixed solvent composed of these solvents and poor solvents.

Further, in the present invention, the surface layer part in the EL layer may be removed by etching the surface of the EL layer by plasma treatment. In this case, the plasma treatment may be carried out by the above-described method in which only oxygen or an oxygen-containing gas is used, or by a method in which an inert gas such as helium (He) or argon (Ar) is used. The use of the method using an inert gas such as He or Ar is preferred. The use of the inert gas can avoid a reaction on the surface of the luminescent layer. Further, the atmospheric pressure plasma is preferably used from the viewpoint of productivity.

Electroluminescent Element

For the EL element produced as described above, the structure of each of the layers constituting the EL element will be described.

(1) Substrate

Substrates commonly used in conventional EL elements may be used as the substrate in the EL element according to the present invention. For example, in bottom emission-type EL elements, highly transparent base materials are used. In this case, any highly transparent material may be used without particular limitation, and, for example, inorganic materials such as glass and transparent resins may be used. Further, in top emission-type EL elements, transparency is not particularly required of the base material. Accordingly, in this case, in addition to the above-described glass base materials and transparent resins and the like, for example, metal plates such as stainless steel plates are also suitable. Further, the base material is not particularly limited so far as the material can support each layer which will be described later. For example, a base material comprising a pigment or the like added to a transparent base material, or a base material having low transparency due to the inclusion of impurities and the like may also be used.

The transparent resin is not particularly limited so far as the resin can be molded into a film. However, polymeric materials, which are highly transparent and have relatively high solvent resistance and heat resistance, are preferred. Specific examples thereof include polyethersulfone, polyethylene terephthalate (PET), polycarbonate (PC), polyetherether ketone (PEEK), polyvinyl fluoride (PFV), polyacrylate (PA), polypropylene (PP), polyethylene (PE), amorphous polyolefins or fluororesins.

The thickness of the substrate is generally about 0.1 to 2.0 mm.

(2) Electrode Layer

In the present invention, the first electrode and the second electrode are formed so that the EL layer provided on the substrate is held between the first electrode and the second electrode. The pair of first and second electrode layers constitute an anode and cathode, respectively. In this case, at least one of the anode and cathode should be transparent or semi-transparent. Further, the anode is preferably formed of an electroconductive material having a large work function from the viewpoint of allowing holes to be easily injected. On the other hand, the cathode is preferably formed of an electroconductive material having a small work function from the viewpoint of allowing electrons to be easily injected. Further, a plurality of materials may be used as a mixture. For both the electrode layers, the resistance is preferably low. Metal materials are generally used. Alternatively, organic or inorganic compounds may also be used.

Preferred anode materials include, for example, indium oxide and gold. Preferred cathode materials include magnesium alloys (for example, Mg—Ag), aluminum alloys (for example, Al—Li, Al—Ca, and Al—Mg), metallic calcium, and metals having a small work function.

Materials usable as the transparent electrode include ITO (indium tin oxide), tin oxide, and zinc oxide. The ITO electrode is formed on the substrate, for example, by sputtering, electron beam vapor deposition, or ion plating from the viewpoint of improving the transparency or lowering the resistivity.

(3) Luminescent Layer

The luminescent layer constituting the EL layer generally comprises an organic compound, which mainly emits fluorescence or phosphorescence, and a dopant as an assistant. The organic compound may be a low-molecular weight compound or a polymer compound. Organic compounds suitable for use in the luminescent layer include coloring matter materials, metal complex materials, and polymeric materials. Coloring matter materials include cyclopentamine derivatives, tetraphenyl butadiene derivatives, triphenyl amine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumanylamine derivatives, oxadiazole dimers, and pyrazoline dimers.

Metal complex materials include quinolinol aluminum complexes, benzoquinolinol beryllium complexes, benzoxazole zinc complexes, benzothiazole zinc complexes, azomethyl zinc complexes, porphyrin zinc complexes, europium complexes, and metal complexes comprising aluminum (Al), zinc (Zn), beryllium (Be) or the like or a rare earth metal such as terbium (Tb), europium (Eu), or dysprosium (Dy) as a central metal and an oxadiazole, thiadiazole, phenylpyridine, phenylbenzimidazol, or quinoline structure as a ligand.

Polymeric materials include, for example, polyparaphenylenevinylene derivatives, polythiophene derivatives, polyparaphenylene derivatives, polysilane derivatives, polyacetylene derivatives, polyfluorene derivatives, polyvinylcarbazole derivatives, and materials prepared by polymerizing the above coloring matter or metal complex luminescent materials.

Among the above luminescent materials, blue luminescent materials include distyrylarylene derivatives, oxadiazole derivatives, and their polymers, polyvinylcarbazole derivatives, polyparaphenylene derivatives, and polyfluorene derivatives. Among them, polyvinylcarbazole derivatives, polyparaphenylene derivatives, and polyfluorene derivatives as polymeric materials are preferred.

Green light emitting materials include quinacridone derivatives, coumarin derivatives, and their polymers, polyparaphenylenevinylene derivatives, and polyfluorene derivatives. Among them, polyparaphenylenevinylene derivatives and polyfluorene derivatives as polymeric materials are preferred. Red luminescent materials include coumarin derivatives, thiophene ring compounds, and their polymers, polyparaphenylenevinylene derivatives, polythiophene derivatives, and polyfluorene derivatives. Among them, polyparaphenylenevinylene derivatives, polythiophene derivatives, and polyfluorene derivatives as polymeric materials are preferred.

An EL element, which can realize full-color display, can be produced by forming a pattern of each of the above color luminescent materials on the substrate.

In the present invention, since the layer thickness is reduced by removing the surface layer in the EL layer, the thickness of the luminescent layer constituting the EL layer after the removal of the surface layer part is approximately 20 to 2000 angstroms.

(4) Dopant Material

A dopant may be incorporated in the luminescent layer constituting the EL layer, for example, from the viewpoints of improving luminescence efficiency of the EL element and varying luminescence wavelength. Such dopant materials include, for example, perylene derivatives, coumarin derivatives, rubrene derivatives, quinacridone derivatives, squalium derivatives, porphyrin derivatives, styryl coloring matters, tetracene derivatives, pyrazolone derivatives, decacyclene, and phenoxazone.

The solvent for dissolving or dispersing the above luminescent material and dopant material is not particularly limited. Examples of suitable solvents usable herein include aromatic solvents including isomers of benzene, toluene and xylene and mixtures thereof, and isomers of mesitylene, tetralin, p-cymene, cumene, ethylbenzene, diethylbenzene, butylbenzene, chlorobenzene, and dichlorobenzene, and mixtures thereof, ether solvents including anisole, phenetole, butyl phenyl ether, tetrahydrofuran, 2-butanone, 1,4-dioxane, diethyl ether, diisopropyl ether, diphenyl ether, dibenzyl ether, and diglyme, chloro solvents such as dichloromethane, 1,1-dichloroethane, 1,2-dichloroethane, trichloroethylene, tetrachloroethylene, chloroform, carbon tetrachloride, and 1-chloronaphthalene, and cyclohexanone. A mixed solvents composed of two or more of these solvents may also be used. An EL layer may be formed by dissolving the luminescent material and the dopant material in the above solvent to prepare a coating liquid, coating the coating liquid onto the base material in the same manner as described above, and drying the coating.

(5) Buffer Layer

In the present invention, in addition to the step of forming the luminescent layer in the EL layer, the step of forming a buffer layer may be provided. The buffer layer functions to facilitate the injection of charges into the luminescent layer and is provided between the anode and the luminescent layer or between the cathode and the luminescent layer. Further, the provision of the buffer layer can smoothen a surface of the electrode layer.

The buffer layer contains an organic material, particularly an organic electroconductor, and the like and may be formed, for example, using an electroconductive polymer. The "buffer layer" is a concept including a hole injection layer and/or a hole transport layer.

When the electroconductivity of the buffer layer is high, preferably, the buffer layer has been patterned from the viewpoints of maintaining diode characteristics of the EL element and preventing cross-talk. When the electroconductivity of the buffer layer is low, there is no need to pattern the buffer layer, and the buffer layer may be omitted.

Specific examples of materials for buffer layer formation include polyalkylthiophene derivatives, polyaniline derivatives, polymers of hole transport materials such as triphenyl amine, sol gel films of inorganic compounds, films of polymers of organic materials such as trifluoromethane, and films of Lewis acid-containing organic compounds.

The buffer layer may be formed in the same manner as in the formation of the conventional luminescent layer, and examples thereof include vapor deposition, electrodeposition, and coating methods using a melt, solution, or mixed liquid of the material, for example, spin coating, casting, dipping, bar coating, blade coating, roll coating, gravure coating, flexography, and spray coating.

The thickness of the buffer layer is approximately about 100 to 2000 angstroms.

(6) Insulating Layer

The insulating layer functions to cover the edge part of the first electrode provided on the substrate in providing a plurality of EL layers on an identical substrate. When the electrode has an angular edge part, the film thickness at the edge part is somewhat smaller than the other part. Intensive application of voltage occurs on the part having a smaller thickness, leading to a deterioration in the element. The provision of an insulating film so as to cover the edge part of the electrode can avoid voltage concentration at the edge part of the electrode and can reduce defects attributable to short-circuiting of the element. Accordingly, an EL element, which has a long service life and can stably emit light, can be realized.

The material for constituting the insulating layer is not particularly limited so far as it can be patterned. The insulating layer may be formed, for example, by forming a pattern having a layer thickness of about 1 µm using an ultraviolet curable resin or the like. In the present invention, when the luminescent layer is patterned by dry etching, the insulating layer is preferably resistant to dry etching. When the material for insulating layer formation is not resistant to dry etching, preferably, a not less than 1 µm-thick, for example, about 1.5 to 10 µm-thick, preferably 2 to 5 µm-thick, layer is formed to avoid a loss of the insulating layer upon dry etching.

The EL element according to the present invention may comprise, in addition to the above layers, for example, a hole injection layer between the first electrode and the luminescent layer from the viewpoint of improving the luminescence efficiency. Further, an electron injection layer may be provided between the luminescent layer and the second electrode.

The EL element may have, but not limited to, the following constructions.

Base material/first electrode/buffer layer/luminescent layer/second electrode.

Base material/first electrode/buffer layer/luminescent layer/electron injection layer/second electrode.

Base material/first electrode/buffer layer/electron blocking layer/luminescent layer/electron injection layer/second electrode.

Base material/first electrode/buffer layer/electron blocking layer/luminescent layer/hole blocking layer/electron injection layer/second electrode.

EXAMPLES

The production process of an EL element according to the present invention will be described in more detail with reference to the following Examples. However, it should be noted that the present invention is not limited to these Examples.

Example 1

Removal of Surface Layer in Luminescent Layers with Solvent (1) Provision of Base Material Preparation of Coating Liquid for Buffer Layer Formation γ-Glycidoxypropyltrimethoxysilane containing a glycidoxy group ($-CHOCH_2$) as an organic functional group (TSL8350, manufactured by Toshiba Silicone Co., Ltd.) was added to a commercially available material for buffer layer formation (poly-3,4-ethylenedioxythiophene/polystyrene sulfonate: PEDT/PSS; Baytron P, manufactured by Bayer) to a concentration of 1% by weight based on the solid content of PEDT/PSS to prepare a coating liquid for buffer layer formation.

A substrate having a size of 6 in. square and a thickness of 1.1 mm with a patterned ITO electrode provided thereon was provided and was cleaned. The coating liquid (0.5 ml) for buffer layer formation prepared above was dropped on this substrate, followed by spin coating at 2500 rpm for 20 sec to form a buffer layer on the base material. The thickness of the buffer layer was 800 angstroms.

(2) Formation of Luminescent Layer

A coating liquid comprising, as red luminescent organic materials, 70 parts by weight of polyvinylcarbazole, 30 parts by weight of oxadiazole, 1 part by weight of a dicyanomethylenepyran derivative, and 4900 parts by weight of monochlorobenzene was prepared, and 1 ml of the coating liquid was dropped onto the buffer layer to conduct spin coating (at 2500 rpm for 10 sec) to form a luminescent layer. The thickness of the luminescent layer was 1000 angstroms.

A positive-working photoresist liquid (OFPR-800, manufactured by Tokyo Ohka Kogyo Co., Ltd.) (2 ml) was dropped on the luminescent layer to conduct spin coating (by holding at 500 rpm for 10 sec and then holding at 2000 rpm for 20 sec) to form a photoresist layer, and the coating was vacuum dried at 25° C. for 30 min for prebaking. The thickness of the photoresist layer was about 1 µm.

Next, ultraviolet light was applied through an exposure mask by an alignment exposure machine to the luminescent layer in its parts to be removed for exposure. Subsequently, development was carried out with a resist developing solution (NMD-3, manufactured by Tokyo Ohka Kogyo Co., Ltd.) for 20 sec, followed by washing with water to remove the photoresist layer in its exposed parts.

Post baking was carried out at 120° C. for 30 min, and the photoresist-removed parts where the luminescent layer had been exposed, were subjected to reactive ion etching with oxygen plasma to remove a part of the luminescent layer for patterning. Thus, a first luminescent layer patterned in a desired form was formed.

Subsequently, here again, 0.5 ml of the coating liquid for buffer layer formation as described above was dropped onto the substrate on its part free from the first luminescent layer to conduct spin coating (at 2500 rpm for 20 sec), followed by drying at room temperature under reduced pressure to form a second buffer layer on the base material. The thickness of the second buffer layer was 800 angstroms.

Thereafter, a coating liquid comprising, as green luminescent organic materials, 70 parts by weight of polyvinylcarbazole, 30 parts by weight of oxadiazole, 1 part by weight of coumarin 6, and 4900 parts by weight of monochlorobenzene was prepared. This coating liquid (1 ml) was dropped on the second buffer layer to conduct spin coating (at 2500 rpm for 10 sec), and the coating was dried at room temperature under reduced pressure, followed by patterning in the same manner as described above to form a second luminescent layer.

Subsequently, here again, coating liquid (0.5 ml) for buffer layer formation as described above was dropped on the substrate in its part free from the first and second luminescent layers to conduct spin coating (at 2500 rpm for 20 sec), and the coating was dried at room temperature under reduced pressure to form a third buffer layer on the base material. The thickness of the third buffer layer was 800 angstroms.

Further, a coating liquid comprising, as blue luminescent organic materials, 70 parts by weight of polyvinylcarbazole, 30 parts by weight of oxadiazole, 1 part by weight of perylene, and 4900 parts by weight of monochlorobenzene was prepared. This coating liquid (1 ml) was dropped on the third buffer layer to conduct spin coating (at 2500 rpm for 10 sec), and the coating was dried at room temperature under reduced pressure, followed by patterning in the same manner as described above to form a third luminescent layer.

The remaining photoresist layer on the first, second, third luminescent layers was separated and removed with acetone.

(3) Cleaning of Luminescent Layer with Solvent (Step of Removing Surface Layer Part in EL Layer)

A resin film impregnated with monochlorobenzene was pressed against the surface of the patterned luminescent layers, was held in this state for one min, and was then separated from the assembly.

The separated resin film was observed, and, as a result, it was found that the surface layer part in the luminescent layers was transferred onto the resin film side.

(4) Formation of Second Electrode

After cleaning of the luminescent layers, the assembly was dried at 100° C. for one hr. Calcium was then vapor deposited as a second electrode on the luminescent layers to a thickness of 500 angstroms. Further, silver (Ag) was vapor deposited as a protective film on the second electrode layer to a thickness of 2500 angstroms to prepare an EL element 1 having a construction of base material/first electrode/buffer layer/luminescent layers (R, G, B)/second electrode.

Example 2

Removal of Surface Layer in Luminescent Layers by Plasma Treatment

An EL element 2 having a construction of base material/first electrode/buffer layer/luminescent layer (R, G, B)/second electrode was prepared in the same manner as in Example 1, except that, in the step of removing the surface layer part in the EL layers, the surface of the formed individual luminescent layers was subjected to plasma treatment. The plasma treatment was carried out in an argon gas atmosphere under conditions of RF power 200 W and chamber pressure 10 mTorr.

Example 3

Removal of Surface Layer in Luminescent Layers with Solvent

An EL element 3 having a construction of base material/first electrode/buffer layer/luminescent layers (R, G, B)/second electrode was prepared in the same manner as in Example 1, except that, in the step of removing the surface layer part in the EL layers, a mixed solvent composed of monochlorobenzene and ethyl acetate (mixing ratio=1:1) was dropped on the surface of the formed individual luminescent layers, and the assembly was spun by spin coater at 3000 rpm to clean the surface layer part in the luminescent layers.

Comparative Example 1

An EL element 4 having a construction of base material/first electrode/buffer layer/luminescent layers (R, G, B)/second electrode was prepared in the same manner as in Example 1, except that the second electrode layer was formed without carrying out the step of removing the surface layer part in the EL layers.

Evaluation of Luminescence Characteristics of EL Element

For each of the EL elements 1 to 4 thus obtained, the ITO electrode side was connected to a positive electrode, the Ag electrode side was connected to a negative electrode, and voltage was applied by a source meter to energize the EL element.

As a result, for all the EL elements 1 to 3, luminescence was observed from each of the luminescent layers upon the application of a voltage of 3 V.

On the other hand, for the EL element 4 not subjected to the cleaning step, as compared with the EL elements 1 to 3, the EL element 4 was clearly inferior in luminescence intensity upon the application of a voltage of 3 V, although luminescence from each of the luminescent layers was observed upon the application of a voltage of 5 V.

Further, for the EL element 4 not subjected to the removal of the surface layer part in the luminescent layers, a number of dark spots considered attributable to the residue of the resist were observed within luminescent pixels. On the other hand, for all the EL elements 1 to 3 subjected to the removal of the surface layer part in the luminescent layers, the dark spots were not observed, and good luminescence could be realized.

What is claimed is:

1. A process for producing an electroluminescent element comprising a patterned electroluminescent layer, said process comprising the steps of:

forming an electroluminescent layer on a substrate having at least an electrode layer formed thereon;

covering a photoresist layer on said electroluminescent layer;

exposing said photoresist layer through a photomask and developing the exposed photoresist layer to pattern the photoresist layer;

removing the electroluminescent layer in its areas, which are exposed on the surface of the assembly and are not covered with the photoresist layer as a result of said patterning of the photoresist layer, to pattern said electroluminescent layer;

removing the remaining photoresist on the electroluminescent layer covered with said photoresist layer; and further removing the surface layer part of the electroluminescent layer from which said photoresist has been removed.

2. The process according to claim 1, wherein the surface layer part of said electroluminescent layer is removed to a depth of 5 to 300 nm from the outermost surface of the electroluminescent layer.

3. The process according to claim 1 or 2, wherein the surface layer part of said electroluminescent layer is removed by cleaning the outermost surface of the electroluminescent layer with a solvent that can dissolve only a materials for electroluminescent layer formation.

4. The process according to claim 1 or 2, wherein the surface layer part of said electroluminescent layer is removed by subjecting the outermost surface of the electroluminescent layer to plasma treatment.

5. The process according to claim 1, wherein said electroluminescent layer comprises at least a buffer layer and a luminescent layer.

6. The process according to claim 3, wherein the solubility of said luminescent layer in said solvent is not less than 0.0001 as measured under conditions of 25° and 1 atm.

7. The process according to claim 1, which further comprises the step of vacuum drying said photoresist layer in the formation of said photoresist layer on said electroluminescent layer.

8. The process according to claim 7, wherein said vacuum drying step is carried out at room temperature.

* * * * *